US012591722B2

(12) United States Patent
Watanabe et al.

(10) Patent No.:  US 12,591,722 B2
(45) Date of Patent:  Mar. 31, 2026

(54) INFORMATION PROCESSING APPARATUS

(71) Applicant: TOYOTA JIDOSHA KABUSHIKI KAISHA, Aichi-ken (JP)

(72) Inventors: Kei Watanabe, Tokyo (JP); Daisuke Akihisa, Tokyo (JP); Hiroshi Oda, Tokyo (JP)

(73) Assignee: TOYOTA JIDOSHA KABUSHIKI KAISHA, Aichi-Ken (JP)

( * ) Notice: Subject to any disclaimer, the term of this patent is extended or adjusted under 35 U.S.C. 154(b) by 0 days.

(21) Appl. No.: 18/646,768

(22) Filed: Apr. 26, 2024

(65) Prior Publication Data

US 2024/0370606 A1    Nov. 7, 2024

(30) Foreign Application Priority Data

May 1, 2023    (JP) .................................. 2023-075791

(51) Int. Cl.
　　*G06F 30/20*　　　(2020.01)
　　*H04N 7/18*　　　(2006.01)
(52) U.S. Cl.
　　CPC ............... *G06F 30/20* (2020.01); *H04N 7/18* (2013.01)

(58) Field of Classification Search
　　CPC .................................. G06F 30/20; H04N 7/18
　　See application file for complete search history.

(56) References Cited

U.S. PATENT DOCUMENTS

2016/0366348 A1 * 12/2016 Dixon .................... H04N 23/74

FOREIGN PATENT DOCUMENTS

JP　　　2017-225108 A　　　12/2017
JP　　　2021-010069 A　　　1/2021

* cited by examiner

*Primary Examiner* — Alazar Tilahun
(74) *Attorney, Agent, or Firm* — HAUPTMAN HAM, LLP

(57)　　　　　ABSTRACT

An information processing apparatus comprises: a controller configured to evaluate largeness of a monitoring possible region that is a region that can be monitored by a predetermined security camera among a region included in a predetermined space on a basis of: structure information regarding a structure existing in the predetermined space; material information regarding a surface material of the structure; and illumination light information regarding illumination light that illuminates the predetermined space.

6 Claims, 7 Drawing Sheets

FIG. 3A

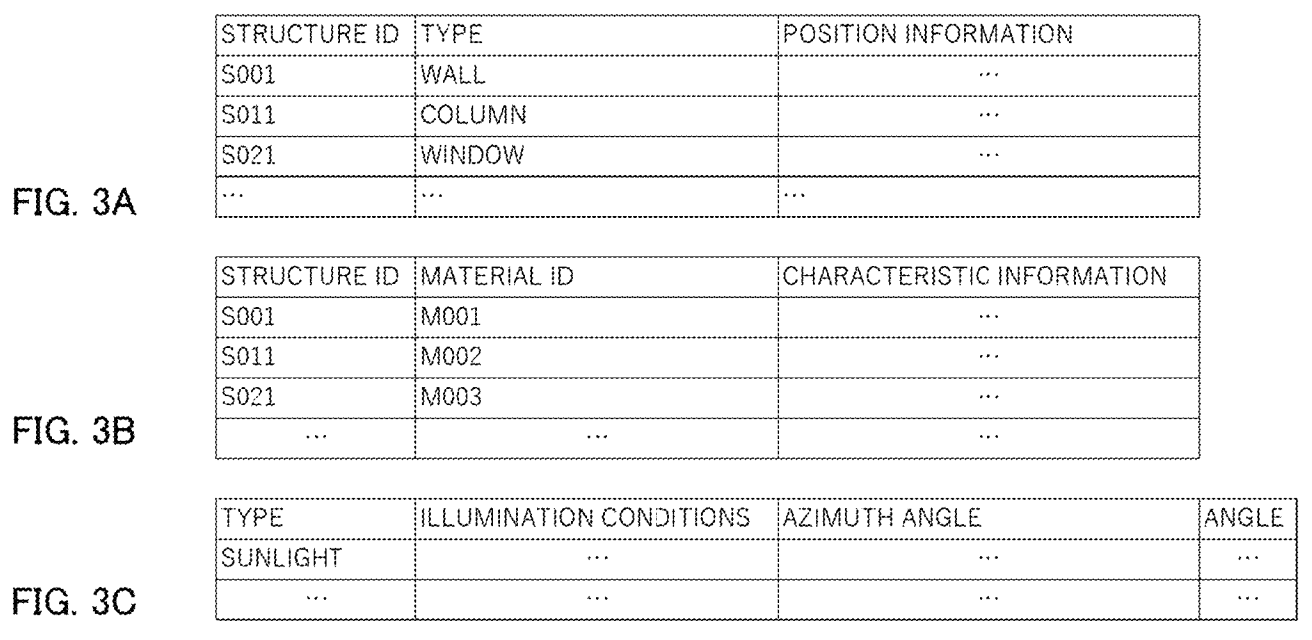

| STRUCTURE ID | TYPE | POSITION INFORMATION |
|---|---|---|
| S001 | WALL | ... |
| S011 | COLUMN | ... |
| S021 | WINDOW | ... |
| ... | ... | ... |

FIG. 3B

| STRUCTURE ID | MATERIAL ID | CHARACTERISTIC INFORMATION |
|---|---|---|
| S001 | M001 | ... |
| S011 | M002 | ... |
| S021 | M003 | ... |
| ... | ... | ... |

FIG. 3C

| TYPE | ILLUMINATION CONDITIONS | AZIMUTH ANGLE | ANGLE |
|---|---|---|---|
| SUNLIGHT | ... | ... | ... |
| ... | ... | ... | ... |

| OBJECT ID | TYPE | SHAPE DATA | TIME POINT INFORMATION | MOVEMENT DATA |
|---|---|---|---|---|
| 001 | PERSON | ⋮ | ⋮ | ⋮ |
| 002 | PERSON | ⋮ | ⋮ | ⋮ |
| 003 | PERSON | ⋮ | ⋮ | ⋮ |
| ⋮ | ⋮ | ⋮ | ⋮ | ⋮ |

FIG. 6

INFORMATION PROCESSING APPARATUS

CROSS REFERENCE TO THE RELATED APPLICATION

This application claims the benefit of Japanese Patent Application No. 2023-075791, filed on May 1, 2023, which is hereby incorporated by reference herein in its entirety.

BACKGROUND

Technical Field

The present disclosure relates to a security camera.

Description of the Related Art

A system for optimizing monitoring by a security camera is known.

For example, Japanese Patent Laid-Open No. 2017-225108 discloses an invention related to a system that changes or corrects a monitoring region of a security camera on the basis of structure information.

SUMMARY

The present disclosure is directed to evaluating a region that can be monitored by a security camera.

The present disclosure in its one aspect provides an information processing apparatus comprising: a controller configured to evaluate largeness of a monitoring possible region that is a region that can be monitored by a predetermined security camera among a region included in a predetermined space on a basis of: structure information regarding a structure existing in the predetermined space; material information regarding a surface material of the structure; and illumination light information regarding illumination light that illuminates the predetermined space.

Further, other aspects include a method to be executed by the above-described information processing apparatus, a program for causing a computer to execute the method, or a computer-readable storage medium in which the program is non-temporarily stored.

According to the present disclosure, it is possible to evaluate a region that can be monitored by a security camera.

BRIEF DESCRIPTION OF THE DRAWINGS

FIGS. 3A to 3C are views for explaining data stored in a storage 12;

FIG. 6 is an example of object data to be utilized in a second embodiment.

DESCRIPTION OF THE EMBODIMENTS

Figure 1:
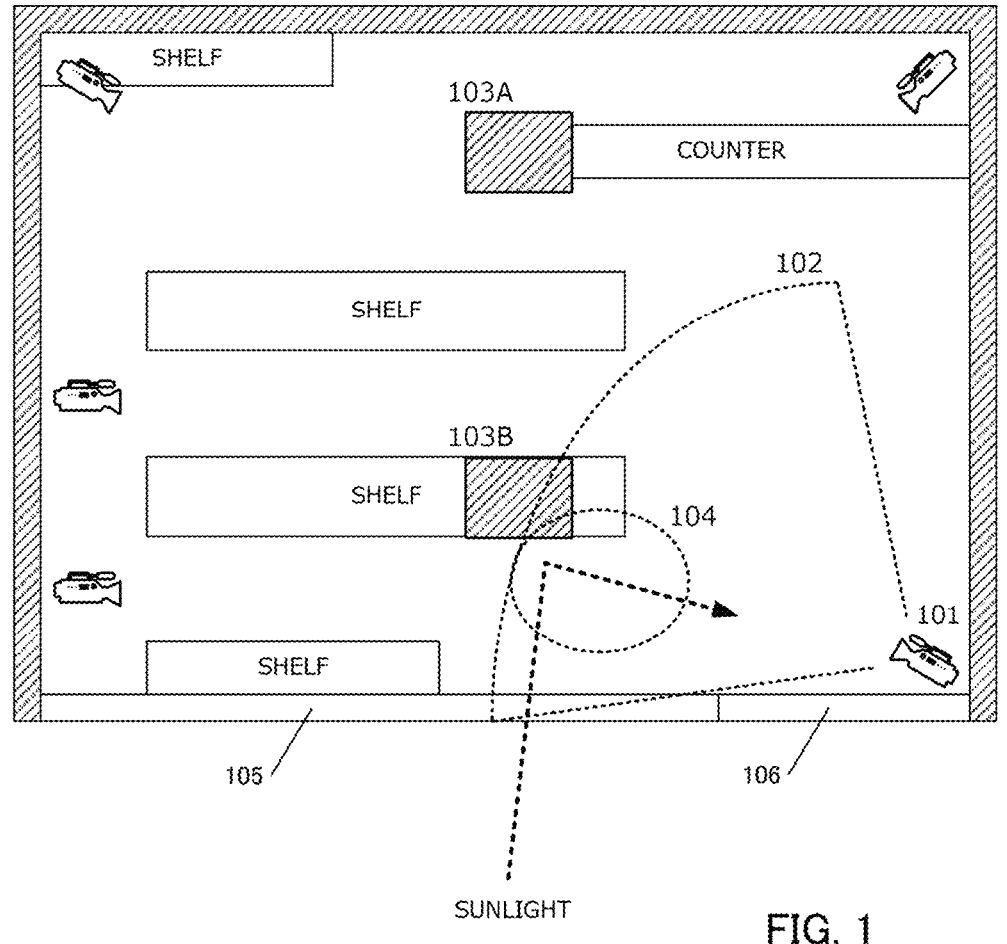
FIG. 1 is a schematic view for explaining a space to be monitored.

A plurality of security cameras are typically utilized to monitor an inside of a predetermined space such as an inside of a store of a commercial facility. In a case where an inside of a facility is monitored by a plurality of security cameras, it is preferable to determine arrangement positions so as to minimize a range that becomes a blind area.

As a technique concerning this, for example, there is a system that calculates regions that can be respectively captured by a plurality of security cameras by utilizing information regarding positions of structures disposed within a space and determines arrangement positions of the security cameras so as to reduce blind areas. This can prevent occurrence of a region that cannot be monitored such as, for example, a region behind a column.

However, in such a system, information other than the information on the structures is not utilized, and thus, there can be a case where a range that can be monitored cannot be appropriately estimated.

For example, a case will be considered where ambient light (such as sunlight) is incident on an inside of a space to be monitored from outside of a building. Here, if sunlight is reflected by a structure inside, there is a case where glare, or the like, occurs in an image captured by a camera, which results in occurrence of a region that cannot be sufficiently monitored.

To solve this problem, it is preferable to simulate a region that can be monitored by the security camera in view of reflection of light.

The information processing apparatus according to the present disclosure solves this problem.

An information processing apparatus according to one embodiment includes a controller configured to evaluate largeness of a monitoring possible region that is a region that can be monitored by a predetermined security camera among a region included in a predetermined space on the basis of structure information regarding a structure existing in the predetermined space, material information regarding a surface material of the structure, and illumination light information regarding illumination light that illuminates the predetermined space.

The predetermined space is a space to be monitored and typically an interior space.

The structure information is information regarding a stationary structure that is located within the space. The structure information may be, for example, information regarding a shape, a size, an arrangement position, and the like, of one or more structures. Further, the structure information may include information regarding openings (such as, for example, a window) provided in the structure. The structure information may be data representing arrangement of a plurality of structures within a three-dimensional space.

The material information is information regarding a surface material of the structure represented by the structure information. The material information may include, for example, information for identifying the surface material and information regarding a light reflectance, and the like, for each material.

The illumination light information is information regarding illumination light that illuminates the predetermined space. The illumination light may be sunlight or artificial light. The illumination light information may include information regarding intensity and an incidence angle of the illumination light. Further, in a case where the illumination light is sunlight, the illumination light information may include information regarding an altitude and an angle of the sun.

The controller evaluates largeness of the monitoring possible region by a plurality of security cameras disposed within the space on the basis of three kinds of information described above. The monitoring possible region indicates a region that can be sufficiently monitored by the security cameras. The monitoring possible region may be a three-dimensional region. The monitoring possible region is not necessarily the same as a region for which an image can be captured by the security camera. As described above, in a case where a region that is difficult to be viewed due to reflection of light occurs among a region for which an image can be physically captured by the security camera (referred to as an imaging region), the monitoring possible region becomes narrower correspondingly.

The controller can determine a physical blind area from a specific position by utilizing the structure information and can determine the imaging region corresponding to a certain security camera. Further, the controller can, for example, simulate reflection of light by utilizing the illumination light information and the material information. This makes it possible to determine that part of the imaging region cannot be monitored (that is, the monitoring possible region becomes narrower than expected) due to the reflected illumination light.

Further, the controller may determine positions at which the plurality of security cameras are to be disposed on the basis of a result of evaluation. For example, the controller may determine arrangement positions of the security cameras so as to maximize the largeness of the monitoring possible region.

Further, the controller may simulate reflection of light that illuminates the predetermined space on the basis of the structure information and the material information and set a region where intensity of the reflected light is equal to or less than a predetermined value when viewed from the security camera as the monitoring possible region.

Further, the controller may perform simulation for each time period and determine arrangement positions of the plurality of security cameras for each time period on the basis of a result of the simulation.

Further, the controller may further acquire object information regarding a dynamic object that moves within the predetermined space and evaluate the monitoring possible region further on the basis of a result of simulating movement of the dynamic object.

Embodiments of the present disclosure will be described below on the basis of the drawings. Configurations of the following embodiments are examples, and the present disclosure is not limited to the configurations of the embodiments.

First Embodiment

Outline of an evaluation apparatus according to a first embodiment will be described. The evaluation apparatus according to the present embodiment is an apparatus that determines optimal arrangement positions of security cameras within a predetermined space.

First, the optimal arrangement positions of the security cameras will be described. FIG. 1 is a plan view illustrating a space to be monitored by a plurality of security cameras. For example, the interior of a commercial facility such as a store can be set as the space to be monitored.

In FIG. 1, hatched regions represent structures such as a wall and a column that obstruct a field of vision. Inside the facility, columns indicated by reference numerals 103A and 103B exist.

A reference numeral 105 represents a glass window, and a reference numeral 106 represents a glass entrance. External ambient light is incident from glass portions. In addition, shelves on which goods are displayed, and a counter for a cash register exist inside the store. The shelves and the counter can be set as part of the structures.

Here, an example will be considered where the interior of such a store is monitored by a plurality of security cameras. A reference numeral 101 is a security camera provided at one corner of the store. The security camera has a predetermined viewing angle. It is assumed here that the security camera 101 can capture an image of a range indicated by a reference numeral 102. Note that in the following description, a three-dimensional region for which an image can be captured by each camera without a physical obstacle will be referred to as an imaging region.

To thoroughly monitor the interior of such a store, the plurality of security cameras are preferably arranged so that the imaging regions by the security cameras can cover the whole region inside the store.

However, with this arrangement, a case remains where a region that cannot be monitored by any security camera occurs.

For example, in the example in FIG. 1, it is assumed that sunlight is incident from outside in a direction of an arrow indicated by a dotted line. Further, it is assumed that a surface of the column 103B is formed with a material with a high light reflectance. In such a case, there is a case where the sunlight incident from outside of the building is reflected by the column 103B and is incident on a lens of the security camera 101. In such a case, there is a case where glare, or the like, occurs in part of the imaging region (for example, a region 104 in FIG. 1), and part of the image lacks (that is, a region that cannot be monitored occurs). In such a case, to monitor the region 104, it is necessary to dispose another security camera. Occurrence of such a phenomenon cannot be inferred only from position information of the structures.

The evaluation apparatus 1 in the present embodiment evaluates the monitoring region by the plurality of security cameras by performing simulation of light in addition to the position information of the structures. Further, favorable arrangement positions of the security cameras are determined on the basis of the evaluation result.

[Apparatus Configuration]

Figure 2:
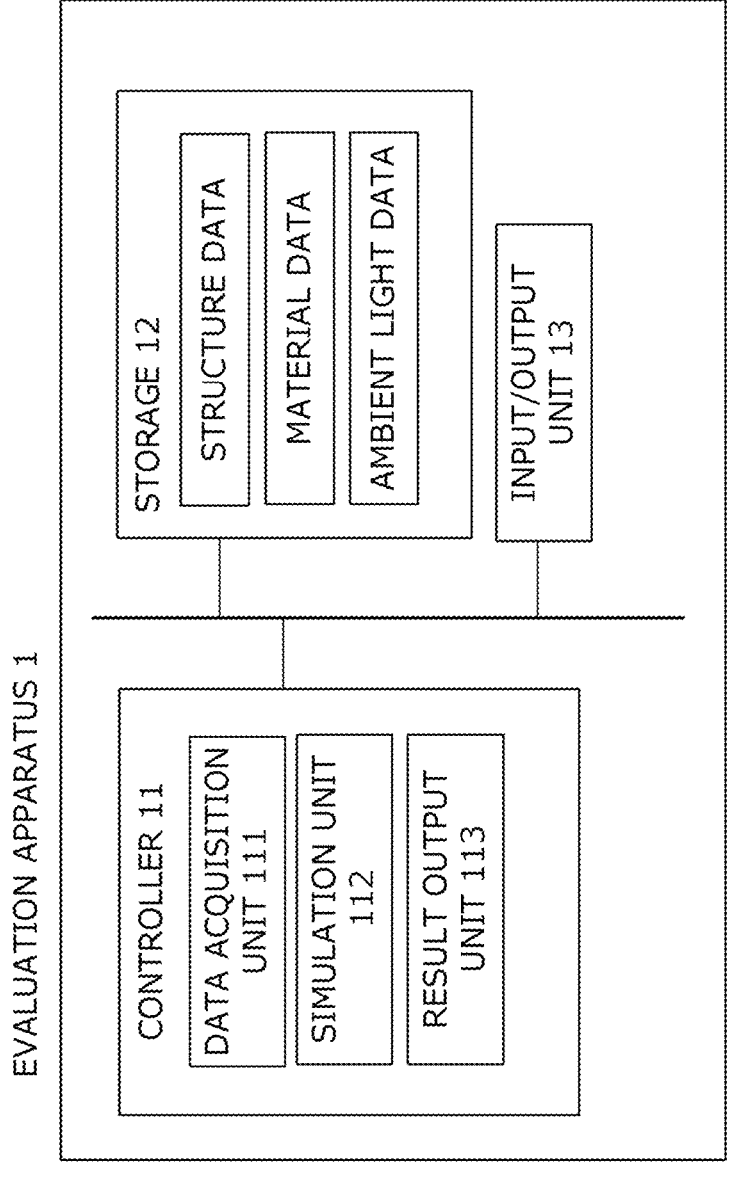
FIG. 2 is a view for explaining a module configuration of an evaluation apparatus 1.

FIG. 2 is a view illustrating an example of a configuration of the evaluation apparatus 1.

The evaluation apparatus 1 is, for example, a computer such as a server apparatus, a personal computer, a smartphone, a mobile phone, a tablet computer and a personal information terminal. The evaluation apparatus 1 includes a controller 11, a storage 12 and an input/output unit 13.

The evaluation apparatus 1 can be constituted as a computer including a processor (such as a CPU and a GPU), a main memory (such as a RAM and a ROM) and an auxiliary memory (such as an EPROM, a hard disk drive and a removable medium). In the auxiliary memory, an operating system (OS), various kinds of programs, various kinds of tables, and the like, are stored, and each function (software module) matching a predetermined purpose as will be described later can be implemented by the programs stored therein being executed. However, part or all of the functions may be, for example, implemented as a hardware module by a hardware circuit such as an ASIC and an FPGA.

The controller 11 is an arithmetic unit that implements various kinds of functions of the evaluation apparatus 1 by executing a predetermined program. The controller 11 can be, for example, implemented by a hardware processor such as a CPU. Further, the controller 11 may include a RAM, a read only memory (ROM), a cash memory, and the like.

The controller 11 includes three software modules of a data acquisition unit 111, a simulation unit 112 and a result output unit 113. Each software module may be implemented by a program stored in the storage 12 which will be described later being executed by the controller 11 (CPU).

The data acquisition unit 111 acquires data for evaluating arrangement positions of security cameras for a predetermined space. In the present embodiment, the data acquisition unit 111 acquires data regarding structures existing within a target space (hereinafter, structure data), data regarding surface materials of the structures (hereinafter, material data) and data regarding ambient light (herein after, ambient light data).

The simulation unit 112 simulates regions that can be respectively monitored by the plurality of security cameras on the basis of the data acquired by the data acquisition unit 111. The simulation includes simulation of ambient light.

The result output unit 113 generates and outputs information regarding favorable arrangement of the plurality of security cameras on the basis of a result of the simulation performed by the simulation unit 112.

The storage 12, which is a unit for storing information, includes a storage medium such as a RAM, a magnetic disk and a flash memory. In the storage 12, a program to be executed by the controller 11, data to be utilized by the program, and the like, are stored.

In the storage 12, the structure data, the material data and the ambient light data acquired by the data acquisition unit 111 are stored.

Here, an example of the structure data will be described. FIG. 3A is an example of the structure data.

The structure data is data regarding shapes and sizes of the structures existing within the space. The structure data includes, for example, fields of a structure ID, a type and position information. In the structure ID field, an identifier allocated for each structure is stored. In the type field, a type of the structure (such as, for example, a column, a wall and a window) is stored. In the position information field, data regarding a position of the structure in the space is stored. Examples of such data can include, for example, a three-dimensional model of the structure, information regarding a size of the structure, information regarding an arrangement position of the structure, and the like. The controller 11 can specify positions of the structures in the space to be monitored by referring to the position information.

Note that the structure data may be a building information modeling (BIM) model or a model using 3D-CAD. Further, the structure data may include data regarding a structure of the building itself.

An example of the material data will be described next. FIG. 3B is an example of the material data.

The material data is data regarding the surface materials of the structures indicated by the structure data. The material data includes, for example, fields of a structure ID, a material ID and characteristic information. In the structure ID field, an identifier allocated for each structure is stored. In the material ID field, an identifier allocated for each surface material is stored. In the characteristic information field, data regarding light reflectance characteristics of the surface material is stored. Examples of such data can include, for example, a light reflection direction and a reflectance. The reflection direction represents a direction in which light is reflected when the light shines on the surface material. The reflectance represents a ratio of reflected light with respect to incident light (ratio of light not absorbed into the material).

Note that while in the present example, the structure data and the material data are separately provided, the both may be one type of data. The both can be integrated by utilizing the BIM model, or the like.

An example of the ambient light data will be described next. FIG. 3C is an example of the ambient light data.

The ambient light data is data regarding ambient light that illuminates the space to be monitored. The ambient light data is specifically data that defines a direction in which the ambient light is incident and intensity of the ambient light. The ambient light data includes, for example, fields of a type, an illumination condition, an azimuth angle, and an angle. In the type field, a type of the ambient light (such as, for example, sunlight and artificial illumination light) is stored. In a case where the ambient light changes in accordance with the season and time of day, in the illumination condition field, related data is stored. For example, a position of the sun constantly changes during the day. Further, an altitude of the sun changes over a year. In such a case, in the illumination condition field, conditions (for example, data indicating date and time of day) are stored. In the azimuth angle field, data indicating an azimuth angle at which the ambient light is incident is stored. In the angle field, data indicating an angle at which the ambient light is incident (for example, an elevation angle of the sun) is stored. Note that the ambient light data may include data regarding characteristics of the ambient light (such as, for example, a wavelength) other than this.

Note that while in the example in FIG. 3C, the azimuth angle and the angle are defined for each illumination condition, in a case where a light source that continuously moves like the sun is defined, these may be expressed with a mathematical expression.

Description will be continued returning to FIG. 2.

The input/output unit 13 is a unit for accepting input operation performed by an operator and presenting information to the operator. Specifically, the input/output unit 13 includes a device for performing input such as a mouse and a keyboard, and a device for performing output such as a display and a speaker. The input/output device may be, for example, integrally constituted with a touch panel display, or the like.

Note that in a specific hardware configuration of the evaluation apparatus 1, omission, replacement and addition of components can be made as appropriate in accordance with embodiments. For example, the controller 11 may include a plurality of hardware processors. The hardware processors may be constituted with a microprocessor, an FPGA, a GPU, and the like. Further, an input/output device (such as, for example, an optical drive) other than those illustrated may be added. Still further, the evaluation apparatus 1 may be constituted with a plurality of computers. In this case, hardware configurations of the respective computers may be the same or do not have to be the same.

[Flowchart]

Figure 4:
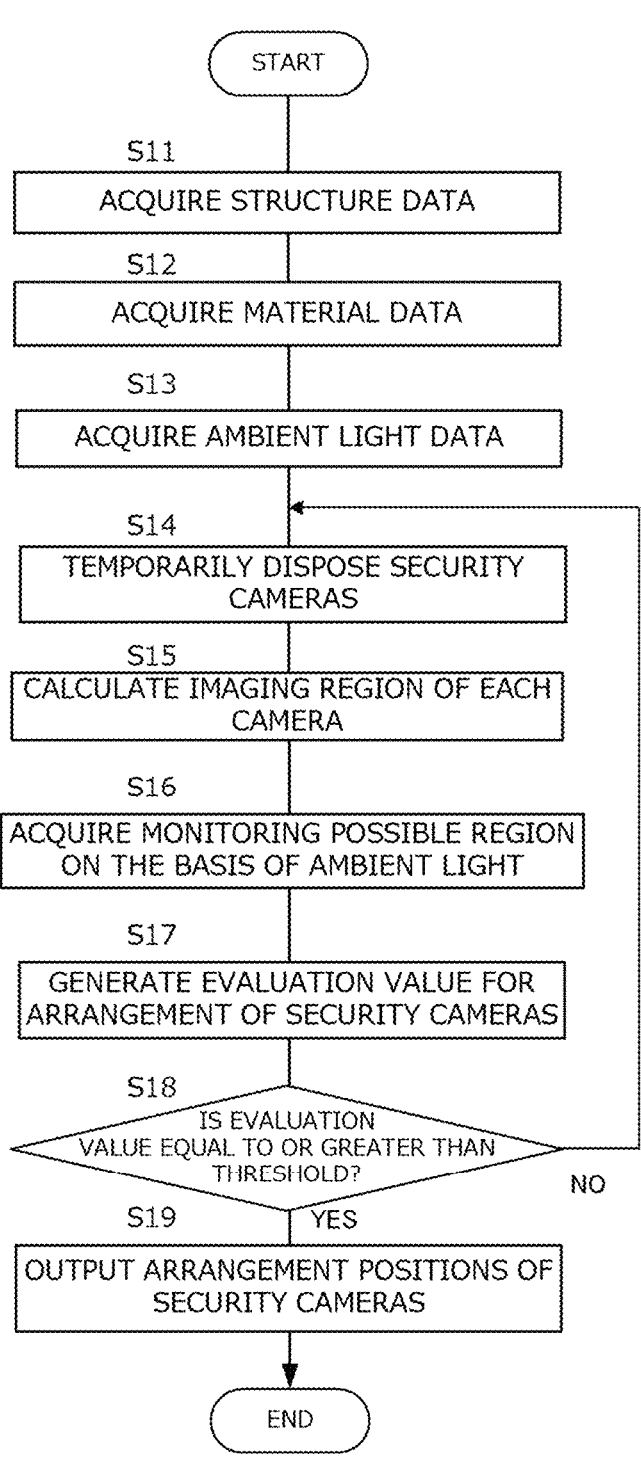
FIG. 4 is a flowchart of processing to be executed in a first embodiment.

Processing to be executed by the evaluation apparatus 1 according to the present embodiment will be described next. FIG. 4 is a flowchart of the processing to be executed by the evaluation apparatus 1. The illustrated processing is started by operation by the operator of the evaluation apparatus 1.

First, in step S11, the data acquisition unit 111 acquires data (structure data) regarding structures included in a space to be monitored. The structure data may be a file, or the like, described in a predetermined format or may be incorporated via the input/output unit 13. The operator of the apparatus can generate structure data for the target space and import the structure data to the evaluation apparatus 1.

Then, in step S12, the data acquisition unit 111 acquires data (material data) regarding surface materials of the structures. The material data may be a file, or the like, described in a predetermined format or may be incorporated via the input/output unit 13. The operator of the apparatus can generate material data corresponding to the structures included in the target space and import the material data to the evaluation apparatus 1.

Then, in step S13, the data acquisition unit 111 acquires data (ambient light data) regarding ambient light that illuminates a space to be monitored. The ambient light data may be a file, or the like, described in a predetermined format and may be incorporated via the input/output unit 13. The operator of the apparatus can generate the ambient light data for the target space and import the ambient light data to the evaluation apparatus 1.

Note that in a case where the ambient light is sunlight, data for tracking a position of the sun for each date and for each time can be made the ambient light data. Further, in a case where the ambient light is artificial light (such as, for example, an illumination device, a light emitting sign, a display and a neon sign), the ambient light data may include data regarding the time of day, and the like, during which these kinds of light are emitted.

From step S14 to step S18 are steps in which virtual security cameras are disposed on a virtual space, and the vision of the virtual security cameras are simulated. These steps are executed by the simulation unit 112.

In step S14, a plurality of virtual security cameras are temporarily disposed on the virtual space. The number of security cameras may be an arbitrary number having a predetermined upper limit. The arrangement positions of the security cameras may be determined using a typical method.

Then, in step S15, imaging regions by the plurality of temporarily disposed security cameras are calculated. In the present step, for example, a region that can be physically viewed in the target space is specified on the basis of parameters (such as, for example, an angle of view and a focal distance) of the security cameras. Further, in the present step, the imaging regions are calculated in view of the structures disposed in the target space on the basis of the structure data acquired in step S11. The imaging regions may be specified by coordinates on the three-dimensional space.

Then, in step S16, calculation regarding the ambient light is performed, a region that cannot be sufficiently monitored is excluded from the imaging region of each security camera, and the obtained region is set as the monitoring possible region.

In the present step, simulation of the ambient light is executed, and whether or not a phenomenon such as halation and glare occurs in each security camera due to the ambient light is determined. Then, in a case where a region that cannot be sufficiently monitored occurs due to the phenomenon, the region (hereinafter, a monitoring impossible region) is excluded from the imaging region. The remaining region is the monitoring possible region. The monitoring possible region means a region that can be monitored without being affected by external factors such as the ambient light.

Figure 5:
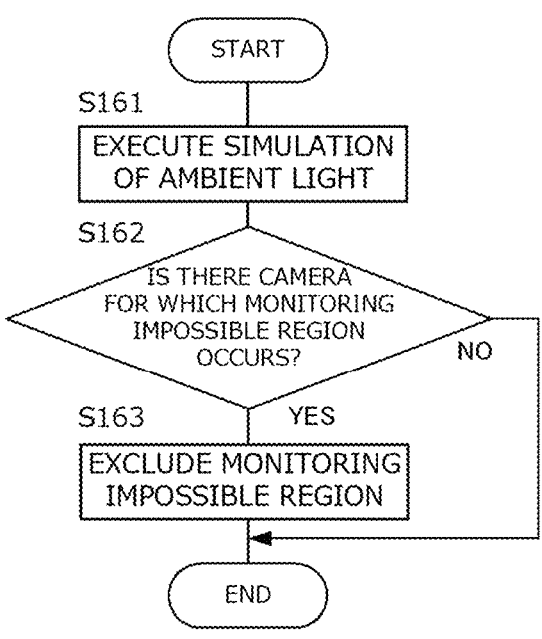
FIG. 5 is a flowchart of the processing to be executed in the first embodiment.

FIG. 5 is a flowchart indicating the processing to be executed in step S16 in more details.

First, in step S161, simulation of the ambient light is executed. The simulation of the ambient light may be performed by, for example, a ray tracing method, or the like. For example, refraction, reflection, and the like, of light occurring on a surface of an object are simulated on the basis of an amount and a direction of light emitted from the light source. In this event, in a case where light is reflected on the surface of the structure, a reflection angle and a reflection amount of light can be calculated using the material data.

Then, in step S162, it is determined whether or not there is a security camera for which a monitoring impossible region occurs due to the ambient light. In the present step, whether or not light is incident with intensity of equal to or greater than a threshold is determined for each of the plurality of security cameras. In the present step, it is determined, for example, whether or not a light flux incident on a surface of a lens provided in the security camera (or a light flux per unit area) is equal to or greater than a predetermined threshold. Here, in a case where there is a security camera on which light is incident with intensity of equal to or greater than a predetermined threshold, it can be estimated that halation or glare may occur on an image captured by the security camera. Further, it can be estimated that a range in which a target cannot be sufficiently viewed occurs in the image as a result of occurrence of halation or glare.

In a case where there is a security camera for which a monitoring impossible region occurs, the processing transitions to step S163. In step S163, the monitoring impossible region is excluded from the imaging region of the security camera, and the remaining region is set as the monitoring possible region. In a case where there is no monitoring impossible region, the imaging region is the same as the monitoring possible region.

In the present step, for example, a range in which a light flux is incident with intensity equal to or greater than predetermined intensity is specified on a lens surface, and the monitoring impossible region may be specified on the basis of the range.

Description will be continued returning to FIG. 4.

In step S17, the result output unit 113 calculates an evaluation value for arrangement of the temporarily disposed security cameras. In the present embodiment, the evaluation value becomes greater as the monitoring possible region is larger among the region included in the space to be monitored. The evaluation value may be, for example, a value representing a volume of the monitoring possible region in percentage with respect to a volume of the space to be monitored. The evaluation value may indicate higher evaluation as the ratio of the monitoring possible region with respect to the region included in the space to be monitored is greater.

Note that in a case where the same region can be monitored by the plurality of security cameras, a volume of the monitoring possible region may be calculated so as not to calculate the volume in an overlapped manner.

Further, the space to be monitored may be weighted. For example, in a case where there is a region to be intensively monitored within the space to be monitored, the evaluation value may be calculated after a greater weight is applied on the region. In this case, in a case where the region can be monitored by a plurality of security cameras, a greater evaluation value may be provided.

In step S18, the result output unit 113 determines whether or not the calculated evaluation value is equal to or greater than the predetermined threshold. Here, in a case where the calculated evaluation value falls below the predetermined threshold, the processing returns to step S14, and temporary arrangement of the security cameras is executed again.

Note that in a case where temporary arrangement of the security cameras is executed a plurality of times, the arrangement positions of the security cameras may be shifted by a predetermined value so as to cover all possible arrangement patterns. Further, a plurality of arrangement patterns of the security cameras may be set in advance, and the security cameras may be temporarily arranged in accordance with the plurality of arrangement patterns. The arrangement positions can be determined using various methods that are employed in optimization calculation.

In step S18, in a case where the calculated evaluation value is equal to or greater than the predetermined threshold, the processing transitions to step S19, and the result output unit 113 outputs a processing result. The processing result may include information regarding arrangement positions and imaging regions of the plurality of security cameras, information regarding the monitoring impossible region, information regarding the monitoring possible region, the calculated evaluation value, and the like. Further, the processing result may include the simulation result of the ambient light. For example, in a case where glare, or the like, due to sunlight occurs in predetermined time period, the time period and information regarding the monitoring impossible region may be output as part of the processing result. For example, information indicating that "there is a possibility that a region that is difficult to be viewed may occur due to light of the sunset in the late afternoon" may be output.

As described above, the evaluation apparatus according to the present embodiment evaluates the monitoring possible region by the security cameras on the basis of the information regarding the structures disposed within the predetermined space and the information regarding the surface materials of the structures. In particular, by simulating the ambient light by utilizing the information regarding the surface materials of the structures, an event in which monitoring is obstructed due to reflection of light can be detected with high accuracy.

Second Embodiment

In the first embodiment, the arrangement positions of the security cameras are evaluated in view of reflection of the ambient light. On the other hand, there can be factors that obstruct monitoring other than the ambient light.

For example, in a case where the target to be monitored is a commercial facility or a parking space, there is a case where a field of view of the security camera may be temporarily obstructed due to movement of people or automobiles.

Here, a case will be considered where a plurality of security cameras are disposed inside a store for the purpose of automatically making payment of goods. While it is necessary to capture an image of the hand of a user of the store to determine that the user of the store takes the goods from the shelf, if the number of users increases, there is a case where the hand of the target user cannot be viewed by being hidden behind the people.

In the second embodiment, to address this, movement of objects that move within the region to be monitored is simulated, the monitoring impossible region due to the objects (for example, region that cannot be viewed by being hidden behind the objects) is calculated, and the evaluation value is corrected. The objects are typically objects that move such as a person, an automobile, a bicycle and a personal mobility. The objects may be living objects or may be non-living objects.

In the second embodiment, the storage 12 is configured to further store data (hereinafter, object data) regarding the objects that move within the space.

FIG. 6 is an example of the object data.

The object data includes a plurality of virtual objects. In the example in FIG. 6, three virtual persons are defined. The object data includes fields of an object ID, a type, shape data, time point information and movement data.

In the object ID field, an identifier of the virtual object is stored. In the type field, for example, a type of the object such as a person and an automobile is stored. In the shape data field, data (shape data) regarding a shape and a size of the object is stored. In a case where the object is a person, the shape data may be data regarding a body height, gender, and the like. Further, in a case where the object is an automobile, the shape data may be data regarding an automobile rank, a shape, a size, and the like, of the automobile. Still further, the shape data may be three-dimensional modeling data.

In the time point information field, information regarding a time period, a time point, or the like, at which the corresponding object appears in the region to be monitored. For example, information indicating that "visits during lunchtime on weekdays" may be provided for a certain virtual person.

In the movement data field, data regarding movement of the corresponding object is stored. For example, in a case where the monitoring target is a store, the movement data may be data that defines movement (time-series change of the position) of a customer from when the customer enters the store until when the customer leaves the store. The movement data may be automatically generated on the basis of a typical pattern of behavior of the customer.

The object data may be prepared by a user of the evaluation apparatus or may be generated on the basis of movement of the objects observed in the past. Further, the object data may be generated by utilizing a machine learning model.

In the second embodiment, the simulation unit 112 is configured to be able to further simulate movement of the objects in addition to simulation regarding the ambient light. Further, the simulation unit 112 updates the evaluation value (evaluation value obtained by the simulation result of the ambient light) on the basis of a result of simulating the movement of the objects. This makes it possible to evaluate the arrangement positions of the security cameras in view of both the ambient light and the movement of the objects.

Figure 7:
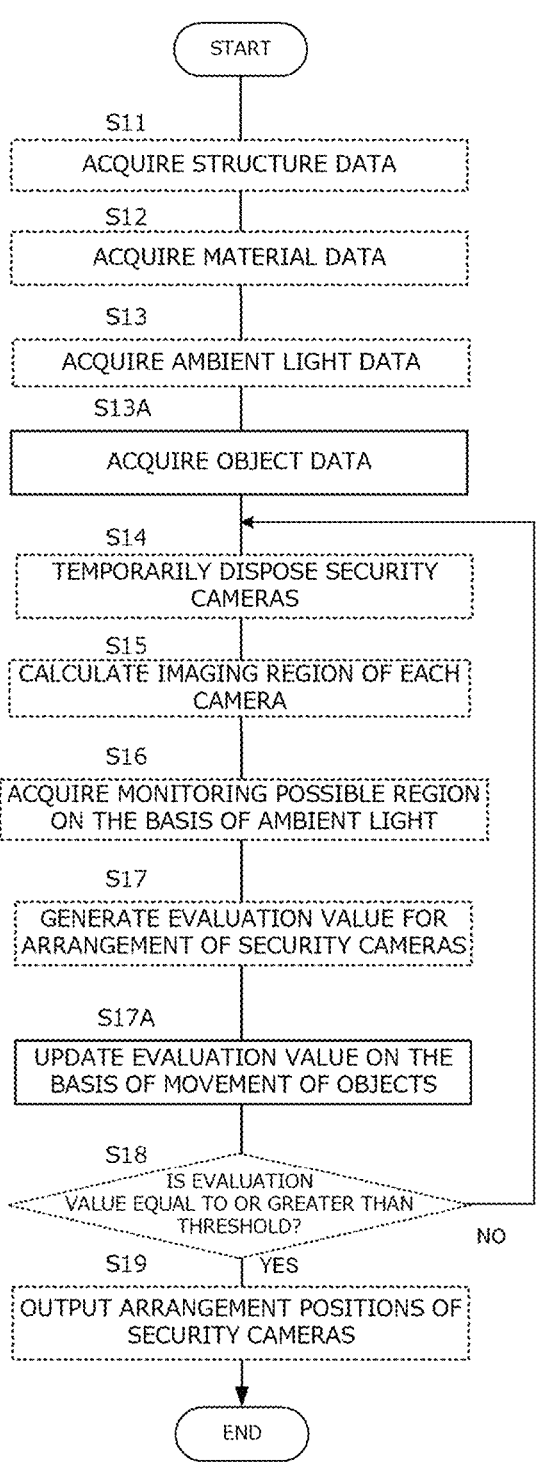
FIG. 7 is a flowchart of processing to be executed in the second embodiment.

FIG. 7 is a flowchart of processing to be executed by the controller 11 in the second embodiment. Processing similar to the processing in the first embodiment is indicated with dashed lines, and description will be omitted.

After the ambient light data is acquired in step S13, in step S13A, the data acquisition unit 111 acquires the object data. The object data may be a file, or the like, described in a predetermined format or may be incorporated via the input/output unit 13. The operator of the apparatus can generate the object data for the target space and import the ambient light data to the evaluation apparatus 1.

The acquired object data is stored in the storage 12.

If the evaluation value is generated in step S17, the simulation unit 112 arranges virtual objects on the virtual space on the basis of the object data and simulates movement of the objects (step S17A).

In the present step, the simulation unit 112 simulates movement of the objects for a predetermined time width and calculates a region shielded by the objects among the monitoring possible region of each security camera for each time step (for example, for each second). For example, the simulation unit 112 calculates that 3% of the monitoring possible region of a certain security camera is shielded by the objects in a certain time step.

By performing this processing on all the time steps, it is possible to calculate an average percentage of the region to be shielded by the objects with respect to the whole region in a predetermined time width. For example, it is possible to obtain a result that while 100% of the monitoring possible region can be monitored in a case where the object does not exist, the largeness of the monitoring possible region decreases to 90% in average from an original value in a case where the objects exist.

The result output unit 113 applies the calculation result to the evaluation value obtained in step S17 to update the evaluation value. In the present step, the evaluation value is corrected to be lower as the region to be shielded by the objects is larger and a period during which the region is shielded by the objects is longer. As a method for correcting the evaluation value, an arbitrary method can be employed.

In step S18, determination is performed by utilizing the evaluation value obtained in this manner.

According to the second embodiment, it is possible to calculate the evaluation value for arrangement of the security cameras in view of shielding occurring due to objects that move within the space to be monitored.

Modifications

The above-described embodiments are merely an example, and the present disclosure can be implemented by being changed as appropriate within a range not deviating from the gist.

For example, the processing and the means described in the present disclosure can be freely combined and implemented unless technical inconsistency occurs.

Further, while in the description of the embodiments, the time period during which the simulation is performed are not particularly limited, the simulation may be executed while the date and time period are designated. Still further, a plurality of simulations may be executed for a plurality of dates and time periods. In this case, the simulations can be performed a plurality of times using the ambient light data and the object data corresponding to the designated dates and time periods.

Further, in this case, favorable arrangement positions of the security cameras may be output for each date and time periods on the basis of the evaluation values obtained for each date and time periods.

Further, the evaluation apparatus 1 may divide target time period into predetermined time slots (for example, for each of 30 minutes) and obtain optimal arrangement positions of the security cameras for each of the time slots.

Further, while in the description of the embodiments, a term of the arrangement positions of the security cameras is used as the meaning of coordinates on which the security cameras are disposed, the arrangement positions of the security cameras may be concept including coordinates and angles (directions in which the lens face) of the security cameras. In this case, in a loop from step S14 to step S18, the evaluation values may be calculated while further changing the directions in which the respective security cameras face.

Further, in a case where the number and arrangement (coordinates) of the security cameras are determined, in a loop from step S14 to step S18, the evaluation values may be calculated while changing only the directions. In other words, the arrangement positions may be concept including only the directions.

Further, while in the description of the embodiments, the security cameras are stationary cameras, the plurality of security cameras may be cameras whose dynamic arrangement positions can be changed (for example, mobilities equipped with cameras). In this case, the evaluation apparatus 1 may transmit instruction information that gives an instruction of favorable positions of the security cameras to a control apparatus that controls the arrangement positions of the security cameras.

Further, the plurality of security cameras may be cameras whose angles (directions) can be dynamically changed. In this case, the evaluation apparatus 1 may transmit instruction information that gives an instruction of angles (directions) to a control apparatus that controls the angles of the security cameras.

Further, in a case where the favorable arrangement positions of the security cameras are different for each time period (time slot), the evaluation apparatus 1 may transmit the instruction information described above to the control apparatus of the security cameras to change the arrangement positions of the security cameras for each time period.

Further, while in the description of the embodiments, the simulation unit 112 automatically generates the arrangement positions of the security cameras, the arrangement positions of the security cameras may be designated by the operator of the evaluation apparatus 1. In this case, conditions regarding the arrangement positions of the security cameras, such as coordinates and directions, may be acquired via the input/output unit 13, and the evaluation value (or a simulation result) under the conditions may be output. In other words, the evaluation apparatus 1 may function as an apparatus that evaluates largeness of the monitoring possible region under the designated conditions.

Further, a process described as being performed by one apparatus may be shared and executed by a plurality of apparatuses. Or alternatively, processes described as being performed by different apparatuses may be executed by one apparatus. In a computer system, what hardware configuration (server configuration) each function is realized by can be flexibly changed.

The present disclosure can be realized by supplying a computer program implemented with the functions described in the above embodiments to a computer, and one or more processors included in the computer reading out and executing the program. Such a computer program may be provided for the computer by a non-transitory computer-readable storage medium connectable to a system bus of the computer or may be provided for the computer via a network. As the non-transitory computer-readable storage medium, for example, any type of disk/disc such as a magnetic disk (a floppy (registered trademark) disk, a hard disk drive ((HDD), or the like) and an optical disc (a CD-ROM, a DVD disc, a Blu-ray disc, or the like), a read-only memory (ROM), a random-access memory (RAM), an EPROM, an EEPROM, a magnetic card, a flash memory, an optical card, and any type of medium that is appropriate for storing electronic commands are included.

What is claimed is:

1. An information processing apparatus comprising:
a controller configured to evaluate largeness of a monitoring possible region that is a region that can be monitored by a predetermined security camera among a region included in a predetermined space on a basis of:
structure information regarding a structure existing in the predetermined space;
material information regarding a surface material of the structure, wherein the material information is retrieved from a database; and illumination light information regarding ambient illumination light that illuminates the predetermined space.

2. The information processing apparatus according to claim 1, wherein the controller determines arrangement positions of a plurality of security cameras, at which the largeness of the monitoring possible region becomes equal to or greater than a predetermined value, on a basis of a result of the evaluation.

3. The information processing apparatus according to claim 2, wherein the controller simulates reflection of light that illuminates the predetermined space on a basis of the structure information and the material information, and sets a region in which intensity of reflected light is equal to or less than a predetermined value as the monitoring possible region.

4. The information processing apparatus according to claim 3, wherein the illumination light information includes information regarding change of the illumination light for each time period, and the controller determines the arrangement positions of the plurality of security cameras for the each time period on a basis of a result of the simulation performed for the each time period.

5. The information processing apparatus according to claim 1, wherein the controller further acquires object information regarding a dynamic object that moves within the predetermined space, and evaluates the monitoring possible region further on a basis of a result of simulating movement of the dynamic object.

6. An information processing apparatus comprising:

a controller configured to evaluate largeness of a monitoring possible region that is a region that can be monitored by a predetermined security camera among a region included in a predetermined space on a basis of:

structure information regarding a structure existing in the predetermined space;

material information regarding a surface material of the structure; and illumination light information regarding illumination light that illuminates the predetermined space, wherein the controller determines arrangement positions of a plurality of security cameras, at which the largeness of the monitoring possible region becomes equal to or greater than a predetermined value, on a basis of a result of the evaluation, wherein the controller simulates reflection of light that illuminates the predetermined space on a basis of the structure information and the material information, and sets a region in which intensity of reflected light is equal to or less than a predetermined value as the monitoring possible region.

\* \* \* \* \*